US010157970B2

(12) United States Patent
Zhang

(10) Patent No.: US 10,157,970 B2
(45) Date of Patent: Dec. 18, 2018

(54) THIN-FILM TRANSISTOR ARRAY SUBSTRATE FOR AMOLED AND MANUFACTURING METHOD THEREOF

(71) Applicant: Shenzhen China Star Optoelectronics Technology Co., Ltd., Shenzhen (CN)

(72) Inventor: Hejing Zhang, Shenzhen (CN)

(73) Assignee: Shenzhen China Star Optoelectronis Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/320,893

(22) PCT Filed: Feb. 25, 2016

(86) PCT No.: PCT/CN2016/074505
§ 371 (c)(1),
(2) Date: Dec. 21, 2016

(87) PCT Pub. No.: WO2017/121010
PCT Pub. Date: Jul. 20, 2017

(65) Prior Publication Data
US 2017/0213883 A1    Jul. 27, 2017

(30) Foreign Application Priority Data

Jan. 13, 2016    (CN) .......................... 2016 1 0022428

(51) Int. Cl.
*H01L 27/32* (2006.01)
*H01L 27/12* (2006.01)
(Continued)

(52) U.S. Cl.
CPC ...... *H01L 27/3262* (2013.01); *H01L 27/3265* (2013.01); *G09G 3/2007* (2013.01);
(Continued)

(58) Field of Classification Search
CPC .................... H01L 29/42384; H01L 27/3265
See application file for complete search history.

(56) References Cited

U.S. PATENT DOCUMENTS 9,768,202 B2    9/2017  Lv et al.
2005/0242745 A1*  11/2005  Jung .................... G09G 3/3233
                                                                315/169.3
(Continued)

FOREIGN PATENT DOCUMENTS

CN    104183608    12/2014
CN    104659285     5/2015

*Primary Examiner* — Marcos D Pizarro
*Assistant Examiner* — Antonio Crite

(57) ABSTRACT

A thin-film transistor array substrate for AMOLED and a manufacturing method thereof are disclosed. The thin-film transistor array substrate includes: a substrate; a plurality of thin-film transistor pixel units mounted on the substrate, each of which includes at least one driving thin-film transistor and at least one switching thin-film transistor; a first electrode pattern layer mounted on the substrate; an insulating layer mounted on the substrate and covering gates of the driving thin-film transistor and the switching thin-film transistor and the first electrode pattern layer; and a second electrode pattern layer mounted on the insulating layer and partially overlapped with the first electrode pattern layer to have an overlapping area and a non-overlapping area; the insulating layer has a larger thickness in the overlapping area and has a smaller thickness in the non-overlapping area.

11 Claims, 3 Drawing Sheets

(51) Int. Cl.
*G09G 3/20* (2006.01)
*G09G 3/3233* (2016.01)

(52) U.S. Cl.
CPC ........ *G09G 3/3233* (2013.01); *H01L 27/1255* (2013.01); *H01L 2227/323* (2013.01)

(56) References Cited

U.S. PATENT DOCUMENTS

| | | | |
|---|---|---|---|
| 2007/0272982 A1* | 11/2007 | Sato | G02F 1/13454 257/347 |
| 2011/0108846 A1 | 5/2011 | Choi et al. | |
| 2015/0243688 A1* | 8/2015 | Lee | H01L 29/7869 257/40 |
| 2015/0371589 A1* | 12/2015 | Kim | G09G 3/3258 345/208 |
| 2016/0307929 A1 | 10/2016 | Zhang | |

\* cited by examiner

THIN-FILM TRANSISTOR ARRAY SUBSTRATE FOR AMOLED AND MANUFACTURING METHOD THEREOF

RELATED APPLICATIONS

This application is a National Phase of PCT Patent Application No. PCT/CN2016/074505 having International filing date of Feb. 25, 2016, which claims the benefit of priority of Chinese Patent Application No. 201610022428.5 filed on Jan. 13, 2016. The contents of the above applications are all incorporated by reference as if fully set forth herein in their entirety.

FIELD AND BACKGROUND OF THE INVENTION

The present invention relates to the field of flat display technology, and more particularly to a thin-film transistor array substrate for AMOLED and a manufacturing method thereof.

A conventional Active-matrix organic light emitting diode (hereinafter, abbreviated as "AMOLED") display apparatus generally includes a substrate, a plurality of thin-film transistors formed on the substrate, and an organic light emitting diode body formed on each of the thin-film transistors. Specifically, the AMOLED display apparatus, in one pixel, has a switching thin-film transistor and a driving thin-film transistor. The switching thin-film transistor is used to address a pixel voltage (i.e. gate driving voltage). The driving thin-film transistor is used to control a driving current of the organic light emitting diode body.

When manufacturing an AMOLED display apparatus, a gate insulator of the switching thin-film transistor and a gate insulator of the driving thin-film transistor are formed simultaneously with the same thickness, which causes the switching thin-film transistor and the driving thin-film transistor to have the same gate capacitance. A sub-threshold swing (S.S.) of a thin-film transistor depends on the gate capacitance; and the gate capacitance further depends on the thickness of the gate insulator. Thus, when the gate insulator of the switching thin-film transistor and the gate insulator of the driving thin-film transistor are formed with the same thickness, the switching thin-film transistor and the driving thin-film transistor will also have the same sub-threshold swing.

However, the switching thin-film transistor requires a small sub-threshold swing to achieve an object of fast charging/discharging; and the driving thin-film transistor requires a relatively large sub-threshold swing to facilitate display of grayscale images. Thus, in the condition that the switching thin-film transistor and the driving thin-film transistor have the same sub-threshold swing, a relatively small sub-threshold swing will be disadvantageous to the AMOLED display apparatus on displaying grayscale images; and a relatively large sub-threshold swing will lower the speed of charging and discharging, and thereby affecting the operation speed of display circuits. Thus, there is a conflict existing between the sub-threshold swing of the driving thin-film transistor and the sub-threshold swing of the switching thin-film transistor.

Furthermore, in the AMOLED display apparatus, electrodes which are perpendicularly crossed may be easily short-circuited under an unstable manufacturing process, and the parasitic capacitance formed at the electrodes and insulating layers therebetween is disadvantageous to higher-order display.

Hence, it is necessary to provide a thin-film transistor array substrate for AMOLED and a manufacturing method thereof to overcome the problems existing in the conventional technology.

SUMMARY OF THE INVENTION

A main object of the present invention is to provide a thin-film transistor array substrate for AMOLED, which structure can facilitate grayscale display and maintain a better operation speed for electric circuits, so as to solve the technical problem where there is a conflict existing between the sub-threshold swing of the driving thin-film transistor and the sub-threshold swing of the switching thin-film transistor.

Another object of the present invention is to provide a manufacturing method of a thin-film transistor array substrate for AMOLED. The manufacturing method is able to effectively increase a sub-threshold swing of the driving thin-film transistor while maintaining a relatively small sub-threshold swing of the switching thin-film transistor. Thus, the display of gray-scale images can be facilitated without affecting operation voltages and circuit operation speed, and thereby improving the display quality of a display panel. In the meantime, the manufacturing method can reduce a probability of short-circuiting of electrodes caused by unstable manufacturing processes, increase production yield, and effectively reduce parasitic capacitance.

In order to achieve the foregoing object, the present invention provides a thin-film transistor array substrate for AMOLED. The thin-film transistor array substrate includes: a substrate; a plurality of thin-film transistor pixel units mounted on the substrate, wherein each of the thin-film transistors includes at least one driving thin-film transistor and at least one switching thin-film transistor; a first electrode pattern layer mounted on the substrate; an insulating layer mounted on the substrate and covering a gate of the driving thin-film transistor, a gate of the switching thin-film transistor and the first electrode pattern layer; and a second electrode pattern layer mounted on the insulating layer and being partially overlapped with the first electrode pattern layer to have an overlapping area and a non-overlapping area; wherein the insulating layer has a larger thickness in the overlapping area and has a smaller thickness in the non-overlapping area.

In one embodiment of the present invention, the insulating layer has a larger thickness in a position corresponding to the gate of the driving thin-film transistor, and has a smaller thickness in a position corresponding to the gate of the switching thin-film transistor.

In one embodiment of the present invention, the thickness of the insulating layer in the overlapping area between the second electrode pattern layer and the first electrode pattern layer is substantially equal to the thickness of the insulating layer in the position corresponding to the gate of the driving thin-film transistor.

In one embodiment of the present invention, the first electrode pattern layer forms a bottom electrode of a storage capacitor and a plurality of scanning lines; the second electrode pattern layer forms a top electrode of the storage capacitor and a plurality of data lines.

In one embodiment of the present invention, the first electrode pattern layer further forms the gate of the driving thin-film transistor and the gate of the switching thin-film transistor; the second electrode pattern layer forms a source and a drain of the driving thin-film transistor, and a source and a drain of the switching thin-film transistor.

In one embodiment of the present invention, the bottom electrode of the storage capacitor is connected to the gate of the driving thin-film transistor; and the top electrode of the storage capacitor is connected to the source of the driving thin-film transistor.

In one embodiment of the present invention, the insulating layer includes silicon oxide layers, silicon nitride layers, or a combination thereof.

The present invention further provides a manufacturing method of a thin-film transistor array substrate for AMOLED, which including the following steps: step 1: providing a substrate; step 2: forming a first electrode pattern layer, gates of a plurality of driving thin-film transistors and gates of a plurality of switching thin-film transistors on the substrate; step 3: forming an insulating layer on the substrate to cover the first electrode pattern layer, the gates of the driving thin-film transistors and the gates of the switching thin-film transistors; step 4: performing a patterning treatment and a partially thinning treatment on the insulating layer so that the insulating layer is patterned and has different thicknesses; step 5: forming a semiconductor layer on the insulating layer in a position corresponding to the gates of the switching thin-film transistors and the gates of the driving thin-film transistors; and step 6: forming a second electrode pattern layer, sources and drains of the switching thin-film transistors, and sources and drains of the driving thin-film transistors on the insulating layer; wherein the second electrode pattern layer is partially overlapped with the first electrode pattern layer to have an overlapping area and a non-overlapping area; wherein the insulating layer has a larger thickness in the overlapping area and has a smaller thickness in the non-overlapping area.

In one embodiment of the present invention, the insulating layer has a larger thickness in a position corresponding to the gates of the driving thin-film transistors, and has a smaller thickness in a position corresponding to the gates of the switching thin-film transistors.

In one embodiment of the present invention, the first electrode pattern layer forms a bottom electrode of a storage capacitor, a plurality of scanning lines, the gates of the driving thin-film transistors and the gates of the switching thin-film transistors; the second electrode pattern layer forms a top electrode of the storage capacitor, a plurality of data lines, the sources and the drains of the driving thin-film transistors and the sources and the drains of the switching thin-film transistors; wherein the insulating layer also has a larger thickness in a position corresponding to where the scanning lines and the data lines are perpendicularly crossed.

The present invention is to perform a patterning treatment on the insulating layer so that it has a larger thickness in a position corresponding to the gates of the driving thin-film transistors and corresponding to the overlapping area where electrodes are perpendicularly crossed with each other, and therefore, a gate capacitor of the driving thin-film transistor can be reduced to increase the sub-threshold swing of the driving thin-film transistor for facilitating grayscale display. In the meantime, the insulating layer is kept to have a smaller thickness in a position corresponding to the gates of the switching thin-film transistors so that the sub-threshold swing of the switching thin-film transistor is maintained at a small value to increase circuit operation speed. That the insulating layer also has a larger thickness in a position corresponding to where the electrodes are perpendicularly crossed with each other can further effectively reduce parasitic capacitance. Thus, the present invention is able to effectively enhance the quality of an AMOLED display apparatus.

DESCRIPTION OF SPECIFIC EMBODIMENTS OF THE INVENTION

The following description of each embodiment is referring to the accompanying drawings so as to illustrate practicable specific embodiments in accordance with the present invention. The directional terms described in the present invention, such as upper, lower, front, rear, left, right, inner, outer, side, etc., are only directions referring to the accompanying drawings, so that the used directional terms are used to describe and understand the present invention, but the present invention is not limited thereto.

Figure 1:
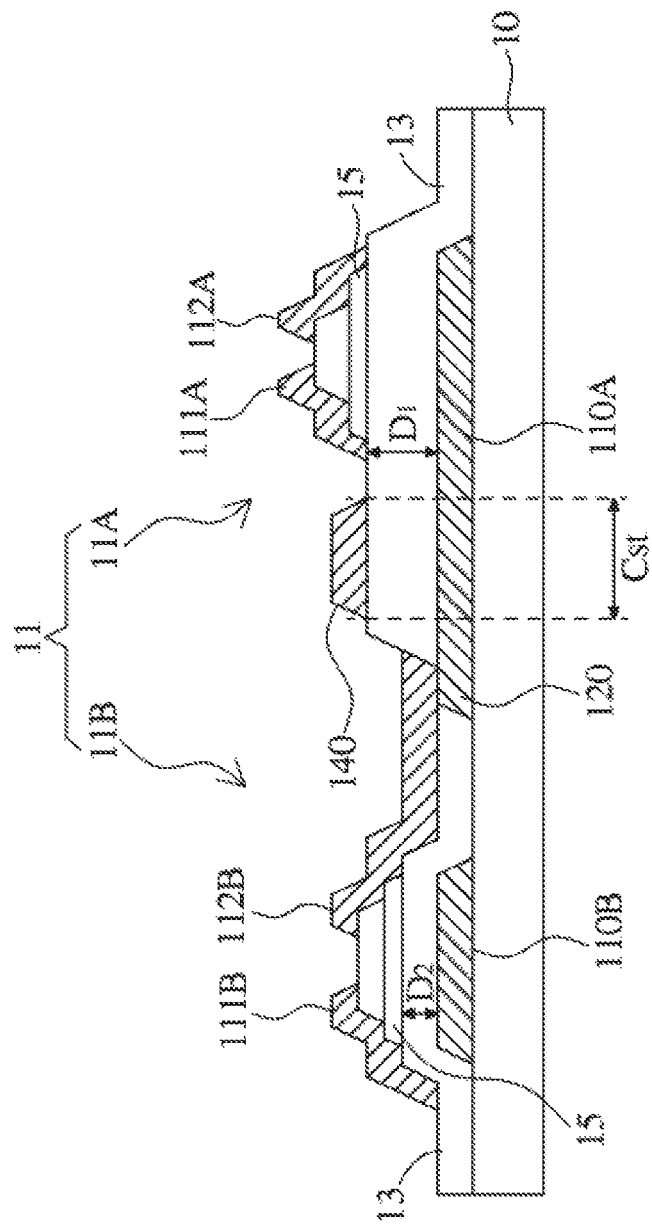
FIG. 1 is a cross-sectional view of a thin-film transistor array substrate for AMOLED according to an embodiment of the present invention.

The present invention provides a thin-film transistor array substrate that is mainly used for an AMOLED display apparatus (i.e., Active-matrix organic light emitting diode display apparatus) which is manufactured by mounting organic light emitting diode devices on the thin-film transistor array substrate and using a driving circuit of the thin-film transistor array substrate to perform individual light control on each pixel formed by each of the organic light-emitting diode devices. With reference to FIG. 1, the thin-film transistor array substrate for AMOLED provided by the present invention mainly comprises a substrate 10, a plurality of thin-film transistor pixel units 11, a first electrode pattern layer 12, an insulating layer 13 and a second electrode pattern layer 14.

The substrate 100 is a transparent substrate, and may be a glass substrate or a plastic substrate.

The thin-film transistor pixel units are arranged in a matrix and are mounted on the substrate 10. Each of the thin-film transistor pixel units 11 includes at least one driving thin-film transistor 11A and a switching thin-film transistor 11B. The switching thin-film transistor 11B is used to address a pixel voltage; and the driving thin-film transistor 11A is used to control a driving current of an organic light emitting diode body.

The first electrode pattern layer 12 is mounted on the substrate 10, and may be formed by depositing and patterning a metal layer. The first electrode pattern layer 12 forms a bottom electrode 120 of a storage capacitor Cst and a plurality of scanning lines. In this embodiment, the first electrode pattern layer 12 further forms a gate 110A of the driving thin-film transistor 11A and a gate 110B of the switching thin-film transistor 11B. The bottom electrode 120 of the storage capacitor Cst is connected to the gate 110A of the driving thin-film transistor 11A.

The insulating layer 13 is mounted on the substrate 10 and covers the gate 110A of the driving thin-film transistor 11A and the gate 110B of the switching thin-film transistor 11B to act as a gate insulating layer. The insulating layer 13 also covers the first electrode pattern layer 12. The insulating layer 13 may include silicon oxide layers, silicon nitride layers, or a combination thereof, but is not limited thereto.

Figure 2:
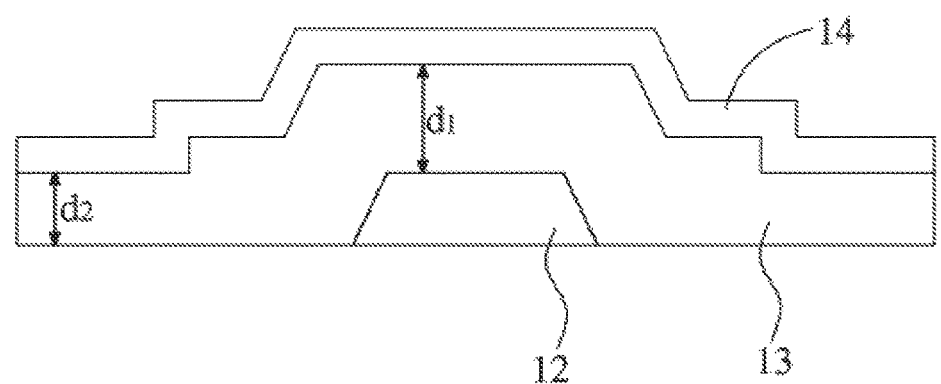
FIG. 2 is a cross-sectional view of a thin-film transistor array substrate for AMOLED according to an embodiment of the present invention, illustrating electrodes being crossed with each other.

The second electrode pattern layer 14 is mounted on the insulating layer 13, and may be formed by depositing and patterning a metal layer. The second electrode pattern layer 14 is partially overlapped with the first electrode pattern layer 12 and therefore has an overlapping area and a non-overlapping area, wherein the insulating layer 13 has a larger thickness in the overlapping area and has a smaller thickness in the non-overlapping area. Specifically, the second electrode pattern layer 14 may form a top electrode of the storage capacitor Cst and a plurality of data lines, wherein the data lines are perpendicularly crossed with the scanning lines formed by the first electrode pattern layer 12. Thus, with further reference to FIG. 2, a position where the scanning lines and the data lines are perpendicularly crossed with each other is the position where the second electrode pattern layer 14 is partially overlapped with the first electrode pattern layer 12. Therefore the insulating layer 13 has a larger thickness d1 in the position corresponding to where the scanning lines and the data lines are perpendicularly crossed with each other, and has a smaller thickness d2 in a position corresponding to where the scanning lines and the data lines are not crossed with each other. The insulating layer 13 has a larger thickness at the overlapping area of the electrode patterns, especially that the insulating layer 13 at where the electrodes are perpendicularly crossed has a larger thickness can not only lower the probability of short-circuiting of the electrodes caused by unstable manufacturing processes and increase production yield, but also effectively reduce the parasitic capacitance formed at the position where the electrodes are perpendicularly crossed.

Figure 3:
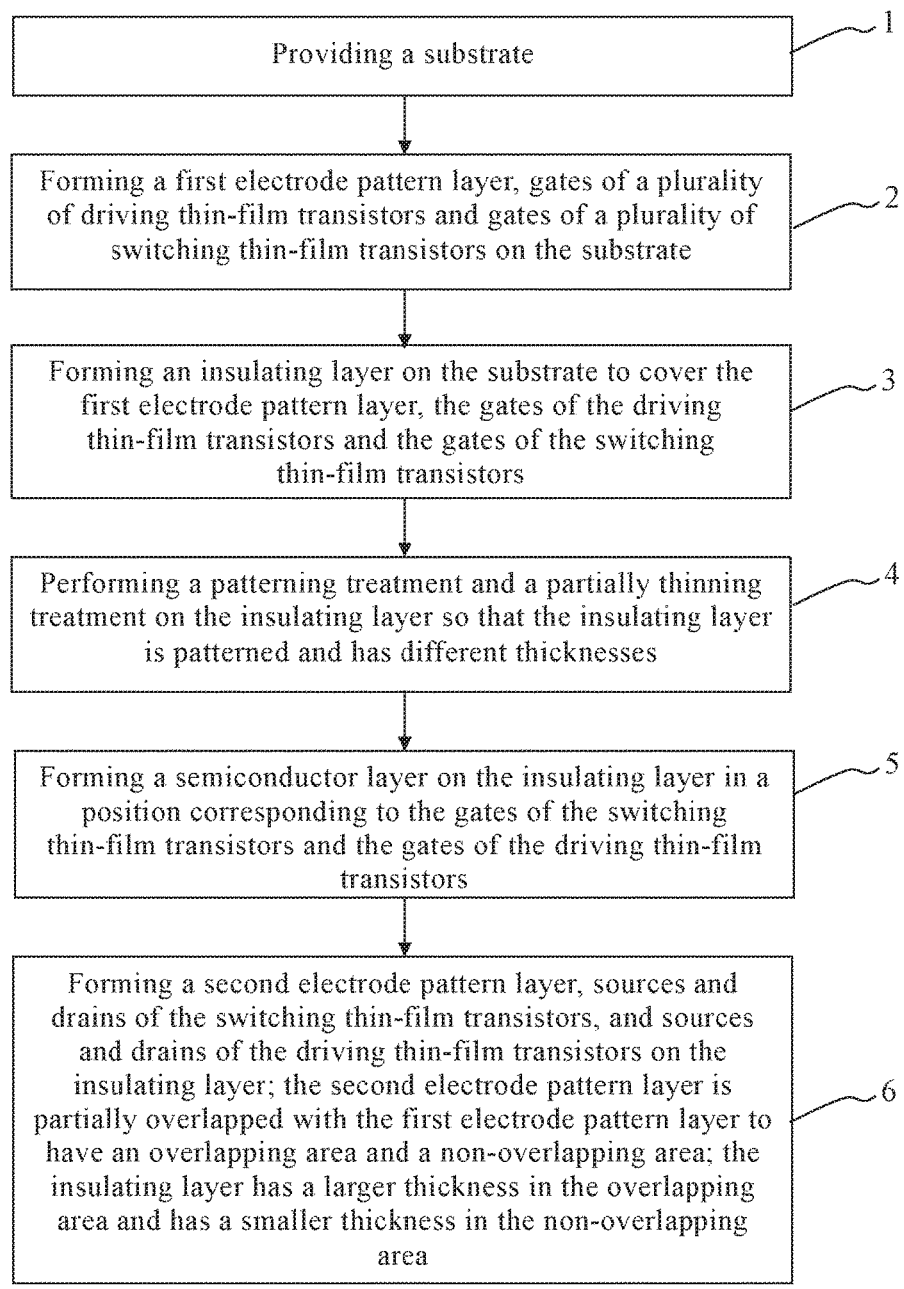
FIG. 3 is a flowchart of a manufacturing method of a thin-film transistor array substrate for AMOLED according to an embodiment of the present invention.

Besides, with reference to FIG. 1, the second electrode pattern layer 14 may further form a source 111A and a drain 112A of the driving thin-film transistor 11A, and a source 111B and a drain 112B of the switch thin-film transistor 11B, wherein the drain 112A of the driving thin-film transistor 11A may be connected to an organic light emitting diode device; and the drain 112B of the switching thin-film transistor 11B may be connected to the gate 110A of the driving thin-film transistor 11A. The top electrode 140 of the storage capacitor Cst is connected to the source 111A of the driving thin-film transistor 11A. With reference to FIG. 1, in this embodiment, the insulating layer 13 also has a larger thickness D1 in a position corresponding to the gate 110A of the driving thin-film transistor 11A, and has a smaller thickness D2 in a position corresponding to the gate 110B of the switching thin-film transistor 11B. Thus, the gate 110A of the driving thin-film transistor 11A with a thicker insulating layer can reduce a gate capacitance of the driving thin-film transistor 11A, and thereby increasing the sub-threshold swing of the driving thin-film transistor 11A, which improves grayscale display. In the meantime, that the insulating layer 13 has a smaller thickness in the position corresponding to the gate 110B of the switching thin-film transistor 11B can maintain a smaller sub-threshold swing for the switching thin-film transistor 11B to increase circuit operation speed. In this embodiment, the thickness of the insulating layer 13 in the overlapping area between the second electrode pattern layer 14 and the first electrode pattern layer 12 is substantially equal to the thickness of the insulating layer 13 in the position corresponding to the gate 110A of the driving thin-film transistor 11A. For example, the thickness d1 of the insulating layer 13 in the position corresponding to where the scanning lines and the data lines are perpendicularly crossed with each other is substantially equal to the thickness D1 of the insulating layer 13 in the position corresponding to the gate 110A of the driving thin-film transistor 11A. For example, With reference to FIG. 1 and further reference to FIG. 3, FIG. 3 is a flowchart of a manufacturing method of a thin-film transistor array substrate for AMOLED according to an embodiment of the present invention. The manufacturing method of the thin-film transistor array substrate mainly includes the following steps:

Step 1: providing a substrate 10.

Step 2: forming a first electrode pattern layer 12, gates 110A of a plurality of driving thin-film transistors 11A and gates 110B of a plurality of switching thin-film transistors 11B on the substrate 10. In an embodiment, the first electrode pattern layer 12 may be formed by depositing and patterning a metal layer, and may form a bottom electrode 120 of a storage capacitor Cst and a plurality of scanning lines, and also form the gates 110A of the driving thin-film transistors 11A and the gates 110B of the switching thin-film transistors 11B.

Step 3: forming an insulating layer 13 on the substrate 10 to cover the first electrode pattern layer 12, the gates 110A of the driving thin-film transistors 11A and the gates 110B of the switching thin-film transistors 11B.

Step 4: performing a patterning treatment and a partially thinning treatment on the insulating layer 13 so that the insulating layer 13 is patterned and has different thicknesses; and a specific photolithography process therefore may be: forming a layer of photoresist on an unpatterned insulating layer, exposing the layer of photoresist through a gray tone mask or a half-tone mask so that the photoresist is exposed with selected degrees, and in the meantime printing the patterns of the mask completely on the photoresist; then removing parts of the photoresist by using suitable developer so that the layer of photoresist can form desired patterns with desired thicknesses.

Step 5: forming a semiconductor layer 15 on the insulating layer 13 in a position corresponding to the gates 110B of the switching thin-film transistors 11B and the gates 110A of the driving thin-film transistors 11A.

Step 6: forming a second electrode pattern layer 14, sources 111B and drains 112B of the switching thin-film transistors 11B, and sources 111A and drains 112A of the driving thin-film transistors 11A on the insulating layer 13; wherein the second electrode pattern layer 14 may be formed by depositing and patterning a metal layer, and may form a top electrode of the storage capacitor, a plurality of data lines, the sources 111A and the drains 112A of the driving thin-film transistors 11A and the sources 111B and the drains 112B of the switching thin-film transistors 11B. The second electrode pattern layer 14 is partially overlapped with the first electrode pattern layer 12 and therefore has an overlapping area and a non-overlapping area; wherein the insulating layer 13, after being patterned through the foregoing photolithography process, correspondingly has a larger thickness in the overlapping area and has a smaller thickness in the non-overlapping area. Preferably, the insulating layer 13 also has a larger thickness in a position corresponding to the gates 110A of the driving thin-film transistors 11A, and has a smaller thickness in a position corresponding to the gates 110B of the switching thin-film transistors 11B. The insulating layer 13 also has a larger thickness in a position corresponding to where the scanning lines and the data lines are perpendicularly crossed Through the foregoing steps, the manufacturing process of thin-film transistor array substrate of the present invention is then completed.

Compared with the conventional technology, the present invention mainly performs a patterning treatment on the insulating layer so that it has a larger thickness in a position corresponding to the gates of the driving thin-film transistors and corresponding to the overlapping area where electrodes are perpendicularly crossed with each other, and therefore, a gate capacitor of the driving thin-film transistor can be reduced to increase the sub-threshold swing of the driving thin-film transistor for facilitating grayscale display. In the meantime, the insulating layer is kept to have a smaller thickness in a position corresponding to the gates of the switching thin-film transistors so that the sub-threshold swing of the switching thin-film transistor is maintained at a small value to increase circuit operation speed. That the insulating layer also has a larger thickness in a position corresponding to where the electrodes are perpendicularly crossed with each other can further effectively reduce parasitic capacitance. Thus, the present invention is able to effectively enhance the quality of an AMOLED display apparatus.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A thin-film transistor array substrate for AMOLED, comprising:
    a substrate;
    a plurality of thin-film transistor pixel units mounted on the substrate, wherein each of the thin-film transistors includes at least one driving thin-film transistor and at least one switching thin-film transistor;
    a first electrode pattern layer mounted on the substrate;
    an insulating layer mounted on the substrate and covering a gate of the driving thin-film transistor, a gate of the switching thin-film transistor and the first electrode pattern layer; the insulating layer has a larger thickness in a position corresponding to the gate of the driving thin-film transistor, and has a smaller thickness in a position corresponding to the gate of the switching thin-film transistor; and
    a second electrode pattern layer mounted on the insulating layer and being partially overlapped with the first electrode pattern layer to have an overlapping area and a non-overlapping area; wherein the insulating layer has a larger thickness in the overlapping area and has a smaller thickness in the non-overlapping area; wherein the first electrode pattern layer forms a bottom electrode of a storage capacitor and a plurality of scanning lines; the second electrode pattern layer forms a top electrode of the storage capacitor and a plurality of data lines; wherein the insulating layer also has a larger thickness in a position corresponding to where the scanning lines and the data lines are perpendicularly crossed.

2. The thin-film transistor array substrate for AMOLED as claimed in claim 1, wherein the insulating layer includes silicon oxide layers, silicon nitride layers, or a combination thereof.

3. The thin-film transistor array substrate for AMOLED as claimed in claim 1, wherein the first electrode pattern layer further forms the gate of the driving thin-film transistor and the gate of the switching thin-film transistor; the second electrode pattern layer forms a source and a drain of the driving thin-film transistor, and a source and a drain of the switching thin-film transistor.

4. The thin-film transistor array substrate for AMOLED as claimed in claim 3, wherein the bottom electrode of the storage capacitor is connected to the gate of the driving thin-film transistor; and the top electrode of the storage capacitor is connected to the source of the driving thin-film transistor.

5. A thin-film transistor array substrate for AMOLED, comprising:
    a substrate;
    a plurality of thin-film transistor pixel units mounted on the substrate, wherein each of the thin-film transistors includes at least one driving thin-film transistor and at least one switching thin-film transistor;
    a first electrode pattern layer mounted on the substrate;
    an insulating layer mounted on the substrate and covering a gate of the driving thin-film transistor, a gate of the switching thin-film transistor and the first electrode pattern layer; and
    a second electrode pattern layer mounted on the insulating layer and being partially overlapped with the first electrode pattern layer to have an overlapping area and a non-overlapping area; wherein the insulating layer has a larger thickness in the overlapping area and has a smaller thickness in the non-overlapping area.

6. The thin-film transistor array substrate for AMOLED as claimed in claim 5, wherein the insulating layer includes silicon oxide layers, silicon nitride layers, or a combination thereof.

7. The thin-film transistor array substrate for AMOLED as claimed in claim 5, wherein the insulating layer has a larger thickness in a position corresponding to the gate of the driving thin-film transistor, and has a smaller thickness in a position corresponding to the gate of the switching thin-film transistor.

8. The thin-film transistor array substrate for AMOLED as claimed in claim 7, wherein the thickness of the insulating layer in the overlapping area between the second electrode pattern layer and the first electrode pattern layer is substantially equal to the thickness of the insulating layer in the position corresponding to the gate of the driving thin-film transistor.

9. The thin-film transistor array substrate for AMOLED as claimed in claim 5, wherein the first electrode pattern layer forms a bottom electrode of a storage capacitor and a plurality of scanning lines; the second electrode pattern layer forms a top electrode of the storage capacitor and a plurality of data lines; wherein the insulating layer also has a larger thickness in a position corresponding to where the scanning lines and the data lines are perpendicularly crossed.

10. The thin-film transistor array substrate for AMOLED as claimed in claim 9, wherein the first electrode pattern layer further forms the gate of the driving thin-film transistor and the gate of the switching thin-film transistor; the second electrode pattern layer forms a source and a drain of the driving thin-film transistor, and a source and a drain of the switching thin-film transistor.

11. The thin-film transistor array substrate for AMOLED as claimed in claim 10, wherein the bottom electrode of the storage capacitor is connected to the gate of the driving thin-film transistor; and the top electrode of the storage capacitor is connected to the source of the driving thin-film transistor.

* * * * *